United States Patent [19]
Cook, Jr.

[11] 3,996,656
[45] Dec. 14, 1976

[54] NORMALLY OFF SCHOTTKY BARRIER FIELD EFFECT TRANSISTOR AND METHOD OF FABRICATION

[75] Inventor: Koy B. Cook, Jr., Cupertino, Calif.

[73] Assignee: Harris Corporation, Cleveland, Ohio

[22] Filed: Dec. 24, 1975

[21] Appl. No.: 643,979

Related U.S. Application Data

[62] Division of Ser. No. 501,204, Aug. 28, 1974, Pat. No. 3,946,415.

[52] U.S. Cl. .................................. 29/571; 357/15; 357/23
[51] Int. Cl.² ........................................ B01J 17/00
[58] Field of Search .................. 29/571; 357/15, 23

[56] References Cited
UNITED STATES PATENTS

| 3,263,095 | 7/1966 | Fang ..................................... 357/15 |
| 3,611,067 | 10/1971 | Oberlin ................................ 357/15 |
| 3,623,925 | 11/1971 | Jenkins ................................ 357/15 |
| 3,673,471 | 6/1972 | Klein ................................... 29/571 |

*Primary Examiner*—W. Tupman
*Attorney, Agent, or Firm*—Leitner, Palan & Martin

[57] ABSTRACT

A normally-off field effect transistor having the structure of an IGFET with a substantially undoped semiconductor material replacing the insulation between the substrate and the gate metal. A Schottky barrier formed between the gate metal and the substantially undoped semiconductor material produces a channel in the substrate when reverse biased. Method of fabrication is also described.

7 Claims, 6 Drawing Figures

3,996,656

NORMALLY OFF SCHOTTKY BARRIER FIELD EFFECT TRANSISTOR AND METHOD OF FABRICATION

This is a divisional of application Ser. No. 501,204, filed Aug. 28, 1974, now U.S. Pat. No. 3,946,415.

BACKGROUND OF THE INVENTION

1. Field of the Invention

The invention relates generally to a field effect transistor (FET) and more specifically to a normally off Schottky barrier field effect transistors.

2. Description of the Prior Art

Field effect transistors, depending upon their structure, are either junction FETs or insulated gate FETs. The insulated gate FETs generally have a spaced drain and source regions formed in a substrate of opposite conductivity type. The source and drain are separated by a channel region upon which a gate is formed. The channel and the gate are separated by an insulator which may be a generic insulator or an oxide.

A common problem of insulated gate field effect transistors (IGFET) is the inversion or depletion of the channel in the substrate by interaction with the gate metal. One solution presented by the prior art is to use a semi-conductor gate instead of a metal gate in contact with the insulator over the channel.

In junction field effect transistors (JFET), the principles of the Schottky barrier have been incorporated. Schottky barrier sources and drains have been produced by forming metal electrodes directly on the ends of the channel regions. Similarly, modulation of the channel region has been effected by Schottky barrier gate electrodes formed directly on the channel region.

Though a majority of the prior art devices have been directed to normally on or depletion mode Schottky barrier FETs, there has been some fabrication of normally off or enhancement mode Schottky barrier FETs. The normally off Schottky barrier FETs of the prior art may only be forward biased only a few tenths of a volt to avoid drawing excess gate current. The limitation on the forward biased voltage of the prior art normally off Schottky barrier FETs limits the range of modulation.

SUMMARY OF THE INVENTION

The present device incorporates a Schottky barrier gate in a generally insulated gate field effect transistor configuration to provide a normally off FET whose channel is formed by reverse biasing the gate with respect to the source or substrate. Source and drain regions are formed in a substrate of opposite conductivity type. A layer of insulator material is formed over the substrate and removed to expose the channel region and contiguous portions of the source and drain regions. A substantially undoped semiconductor material is deposited over the exposed substrate. Standard deposition and formation of the gate and source and drain electrodes completes the fabrication. The gate forms a Schottky barrier with the substantially undoped semiconductor material, which is sufficiently thick to prevent the Schottky barrier state from including the channel region in an unbiased state.

Modification of the fabrication process also provides for a layer of substantially undoped semiconductor material between the layer of insulation over the substrate and the extensions of the source and drain electrodes. A further modification yields a two layer metal source and drain electrode connected through apertures in an interposed layer of the substantially undoped semiconductor material.

OBJECTS OF THE INVENTION

It is an object of the present invention to provide a normally off Schottky barrier field effect transistor with a wide range of modulation.

Another object is to provide Schottky barrier field effect transistors incorporating the advantages of a normally on Schottky barrier FET and the normally off IGFET.

A further object of the invention is to provide a Schottky barrier FET which is economical and easy to manufacture.

Still another object of the present invention is to provide a normally off Schottky barrier FET using the general structure of a MOS FET.

Still another object is to provide a field effect transistor which is faster and more radiation hardened than the Schottky barrier devices of the prior art.

Other objects, advantages and novel features of the present invention will become apparent from the following detailed description of the invention when considered in conjunction with the accompanying drawings.

DESCRIPTION OF THE PREFERRED EMBODIMENTS

Figure 1:
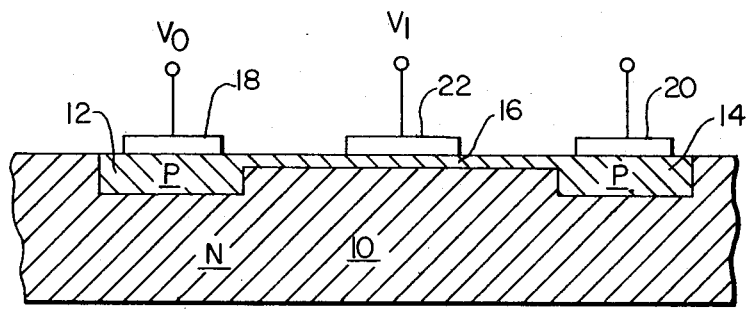
FIG. 1 is a cross-sectional view of a conventionally normally off Schottky barrier field effect transistor.

FIG. 1 illustrates a normally off Schottky barrier field effect transistor of the prior art having a substrate 10 with a source and drain regions 12 and 14 and channel region 16. Metal electrodes 18 and 20 form ohmic contacts with the source 12 and drain 14, respectively and gate electrode 22 forms a Schottky barrier with the channel region 16. The channel region 16 is formed to be thin so that the Schottky barrier formed therewith extends through to the substrate 10 to provide a normally off FET. When the gate electrode 22 is forward biased by $V_1$ with respect to the source electrodes 18 (which is set at a reference voltage $V_0$ or ground), the Schottky barrier recedes and channel region 16 electrically connects source regions 12 and drain region 14 to provide an output signal $V_2$.

Since the channel region 16 is relatively thin, the forward voltage differential between $V_0$ and $V_1$ may only be a few tenths of a volt. Otherwise, excessive gate current is drawn, which significantly reduces the gain of the device. This small range of voltage differential limits the degree of modulation of the channel region and thus limits the range of modulation of the overall FET.

Figure 2:
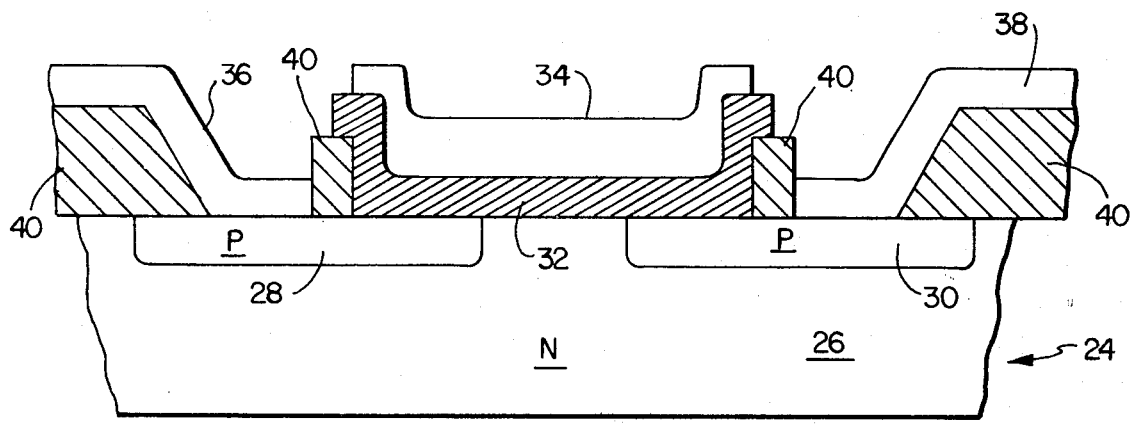
FIG. 2 is a cross-sectional view of a normally off Schottky barrier field effect transistor according to the present invention.

A preferred embodiment of this invention is illustrated in FIG. 2 as a Schottky barrier FET 24. A substrate 26 of the first conductivity type has source and drain regions 28 and 30 of opposite conductivity types formed therein. A substantially undoped semiconductor 32 is superimposed and connects the channel region between source and drain 28 and 30 and contiguous regions of source and drain 28 and 30. Over the substantially undoped semiconductor 32 is a metal gate 34. Metal electrodes 36 and 38 are connected to source and drain regions 28 and 30, respectively. An insulative layer 40 separates the electrodes 36 and 38 from the substrate as well as the substantially undoped semiconductive material 32 from the electrodes 36 and 38.

As illustrated in FIG. 2, the Schottky barrier FET of the present invention has an N conductivity type substrate 26 being made of silicon having a dopant level of 3–5 ohms/cc, for example. The source and drain regions 28 and 30 may be formed, for example, by deposition and diffusion, to have a sheet resistance of 60 ohms per square. The substantially undoped semi-conductor material 32 may be, for example, polysilicon or amorphous silicon and the metal electrodes 34, 36 and 38 may be for example, aluminum. The insulative layer 40 may be, for example, thermally grown silicon dioxide. Though being illustrated as a P channel enhancement mode or normally off Schottky barrier field effect transistor, the device may equally as well as built as an N channel, normally off Schottky barrier field effect transistor. It is noted that FET 24 has a generally configuration of an insulated gate field effect transistor in that source and drains of one conductivity type are formed separate and apart in a substrate of opposite conductivity type. The channel region between source and drain is covered by a first material upon which a gate is applied. Normally, the insulated IGFET has the material between the channel region of the substrate and the gate material being an insulator. The present invention, though having the general appearance of an IGFET, uses a conductive substantially undoped semiconductive material 32 interposed between the gate and the channel region of the substrate.

The interposed material 32 is deposited as undoped semiconductor material, but because of process conditions, this layer is slightly N conductivity type. The present invention is considered to be operative with a semiconductor material layer 32 having dopant impurity levels below $10^{16}$ carriers per cc.

Figure 3:
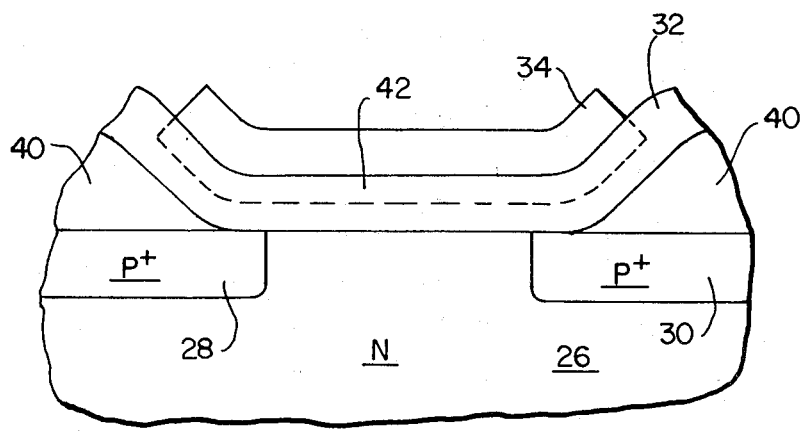
FIG. 3 is an enlarged partial view of FIG. 2, illustrating the depletion region in an unbiased state.

As shown in an enlarged view in FIG. 3, the gate metal 34 forms a depletion region 42 with the substantially undoped semiconductive material 32. In the unbiased state and for gate metals of approximately 50 microns thick, a substantially undoped semiconductive layer 32 of 1500 angstroms is sufficient to prevent the Schottky barrier depletion 42 from reaching the substrate 26 and the source and drain regions 28 and 30 therein. The exact thickness of the layer 32 is a function of the impurity level and the atomic structure of the material used in layer 32.

Figure 4:
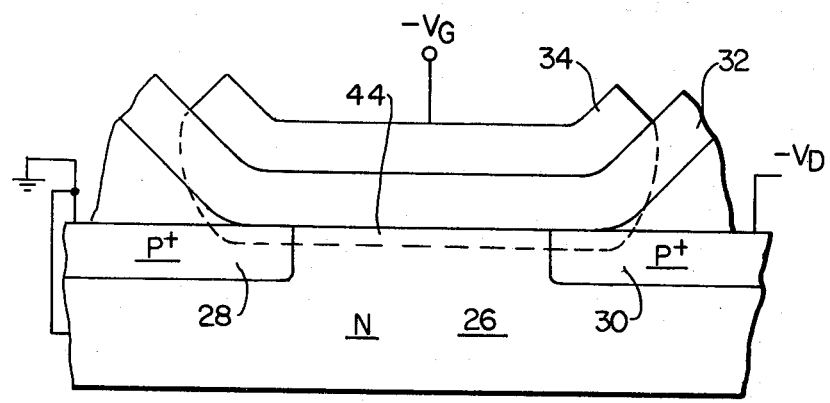
FIG. 4 is an enlarged partial view of FIG. 2, illustrating the depletion region in a reversed biased state.

As shown in FIG. 4, the gate of the Schottky barrier field effect transistor of the present invention is reversed biased relative to the source and the substrate having the source 28 and the substrate 10 connected to a reference voltage or ground, the drain 30 connected to a voltage level $-V_D$ and the gate metal 34 connected to a voltage $-V_G$. With the gate voltage $-V_G$ being greater than the reference voltage or ground, the Schottky barrier formed between the metal conductor 34 and the substantially undoped smeiconductor material 32 is reversed biased and the depletion region 42 is expanded to form a depletion region 44 which extends into the substrate 26 to form a channel region between source and drain region 28 and 30. Further reverse biasing of the gate with respect to the source will increase the size of the highly conductive channel region between source and drain by additionally causing the N type substrate 26 to form a P type channel at the surface thereof.

A method for fabricating the normally Schottky barrier field effect transistor of the present invention begins with a substrate 26 for the first conductivity type. Source and drain regions 28 and 30 are formed therein using standard deposition and diffusion techniques through a mask. The mask may involve a photoresist applied over a thermally grown insulative layer, being for example, silicon dioxide. Apertures are formed within the insulative layer forming a mask for the subsequent deposition and diffusion. Impurities of the conductivity type opposite that of the substrate 26 are used to provide source and drain regions 28 and 30. Though discussing deposition and diffusing, the source and drain regions 28 and 30 in substrate 26 may be formed any of the other well known techniques for example, ion implantation to name one.

After the removal of the mask, a new insulative layer 40 is grown over the surface of the substrate, and the channel region and contiguous portions of source and drain regions 28 and 30 are exposed through the new insulative layer 40. A substantially undoped semiconductive material 32, for example, polysilicon or amorphous silicon, is deposited upon the exposed substrate and the insulative layer 40. The material 32 may be deposited by known deposition techniques. The layer 32 is delineated by known masking and etching techniques to provide and produce the structure shown in FIG. 2.

The wafer is then prepared for deposition and delineation of the gate 34 and source and drain electrodes 36 and 38. A metal, for example, aluminum is deposited upon the substrate and delineated by conventional means, such as silk-screening, physical masking, direct photoresist or reverse photoresist.

Figure 5:
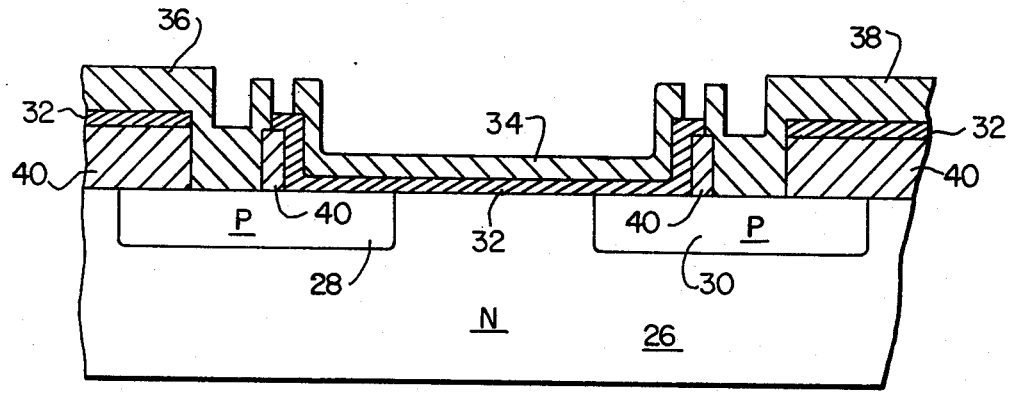
FIGS. 5 and 6 are further embodiments of the present invention.

Another embodiment of the present invention is illustrated in FIG. 5 and includes extending the substantially undoped semiconductor material 32 over the oxide or insulated layer 40 to separate the layer 40 from the metal electrodes 36 and 38 for the source and drain regions, respectively, The extension or additional use of the undoped semiconductor material 32 between the insulative layer 40 and the metal regions 36 and 38 prevent any interaction or inversion of the insulative layer 40 with the metal electrodes 36 and 38. This has presented a problem in the past and caused inversion and/or breakdown of the insulative layer 40 and possible shorting of the source and drain electrodes to the substrate.

The process for fabricating the device as illustrated in FIG. 5 is the same as that discussed above for forming the embodiment of FIG. 2 with the modification of the step for the removal or delinearation of the substantially undoped semiconductive layer 32. To be more specific, after the substrate 26 and contiguous regions of source and drain 28 and 30 are exposed through the insulative layer 40, the layer of substantially undoped semiconductive material 32 is deposited upon the wafer. Using conventional masking techniques, apertures are open in the substantially undoped semiconductor layer and the insulator 40 for the deposition and delineation of the great source and drain electrodes 36 and 38, respectively, simultaneously with the gate 34. Of course, the formation of the embodiment of FIG. 5 requires no additional steps to that method for the fabrication of the method of the embodiment of FIG. 2. In both of the described embodiments, the source and drain electrodes and the gate metal was formed simultaneously.

Figure 6:
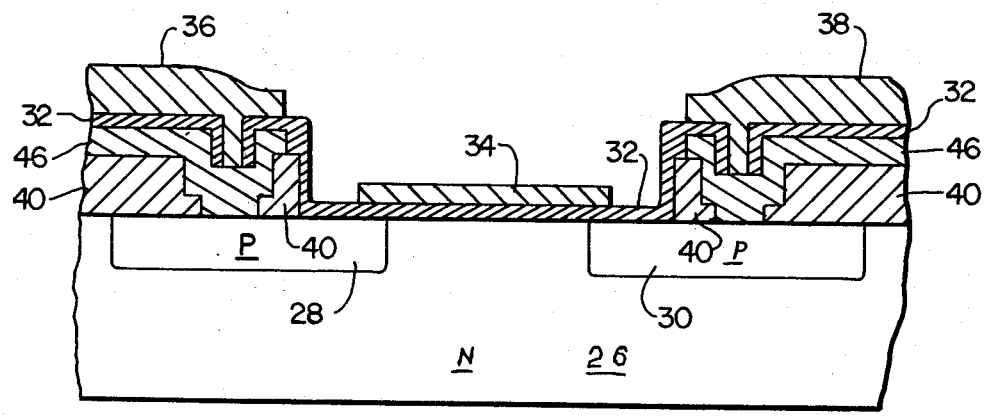

A further embodiment is illustrated in FIG. 6 has an additional metal layer 46 interposed between the substantially undoped conductive semiconductor layer 32 and the substrate 26. The process for the fabrication of the embodiment of FIG. 6 is the same as that described for that of FIG. 2, to the point of forming the source and drain regions 28 and 30 in the substrate 26. After the formation of the source and drain regions, a layer of insulation 40 is formed by oxidation and contact apertures are opened in the oxide layer. A metal layer 46 of aluminum, or aluminum sinter for example, is evaporated and etched to form the resulting layer 46 as illustrated in FIG. 6. The gate region including the surface of substrate 26 and contiguous regions of source and drain regions 28 and 30 is exposed by etching in the oxide layer. The substantially undoped semiconductive material 32 is deposited and contact holes are etched in layer 32 for the connection of source and drain electrodes to the metallic layer 46. An additional deposition and delineation of metal layers is performed to form gate metal 34 and source and drain electrodes 36 and 38.

Though aluminum has been described as the metal used to provide the electrodes and the gate of the present invention, magnesium, zinc, indium, lead and tin or other low work function metals may be used with N conductivity type substrates to provide a Schottky barrier. For N channel devices formed in a P conductivity type substrate. high work function metals such as iron, gold, rhodium, and platinum may be used. The channel region between source 28 and drain 30 should be slightly greater than the contiguous region of the source or drain 28 and 30, which is covered by the substantially undoped semiconductive layer 32. The device of the present invention provides a faster, more radiation hardened normally off field effect transistor than that of the prior art by incorporating the general structure of the insulated gate field effect transistor with the technology of the Schottky barrier. The problems faced by the normally off Schottky barrier field effect transistor of the prior art is overcome by providing a structure which is normally off and is turned on and modulated by reverse biasing the gate with respect to the source.

From the preceding description of the preferred embodiments, it is evident that the objects of the invention are attained and although the invention has been described and illustrated in detail, it is to be clearly understood that the same is by way of illustration and example only and is not to be taken by way of limitation. The spirit and scope of this invention are limited only by the terms of the appended claims.

What is claimed is:

1. A method of fabricating a Schottky barrier transistor comprising the steps of:
   doping a surface of a substrate with impurities of conductivity types opposite the conductivity type of said substrate to form two spaced regions;
   forming an insulating layer over said substrate;
   opening apertures in said insulating layer to expose a first portion of each of said spaced regions;
   depositing a first conductive layer on said insulating layer and through said apertures;
   removing said insulating layer over a section of said substrate between said spaced regions;
   forming a layer of substantially undoped semiconductor material over said section; and
   depositing a gate electrode on said substantially undoped semiconductor material.

2. A method as in claim 1 wherein said section of said substrate includes a second portion of each of said spaced regions.

3. A method as in claim 1 wherein said substantially undoped semiconductor material is formed also on the said first conductive layer and wherein said method includes opening apertures in said substantially undoped semiconductor material to expose portions of said first conductive layer and depositing source and drain electrodes for said two spaced regions through said apertures in said substantially undoped semiconductor material.

4. A method as in claim 3 wherein said substrate is silicon, said semiconductor material being selected from polycrystalline or amorphous silicon, said first conductive layer being aluminum sinter and said gate, source and drain electrodes being formed simultaneously from aluminum.

5. A method of fabricating a field effect transistor comprising the steps of:
   doping a surface of a substrate with impurities of conductivity type opposite the conductivity type of said substrate to form spaced source and drain regions;
   forming an insulating layer over said substrate;
   removing said insulating layer over a section of said substrate between said source and drain regions;
   forming a layer of substantially undoped semiconductor material over said section of said substrate;
   opening apertures in said insulating layer to expose a first portion of said source and drain regions; and
   depositing a gate electrode on said substantially undoped semiconductor layer and source and drain electrodes through said apertures.

6. The method of claim 5 wherein said section includes second portions of said source and drain regions contiguous to said section.

7. The method of claim 6 wherein said substantially undoped semiconductor layer is formed to also cover said insulating layer and apertures exposing said first portions of said source and drain regions are also opened in said substantially undoped semiconductor layer.

* * * * *